United States Patent
Yoo et al.

(10) Patent No.: US 9,577,205 B2
(45) Date of Patent: Feb. 21, 2017

(54) ORGANIC LIGHT-EMITTING DEVICE

(71) Applicant: Samsung Display Co., Ltd., Yongin, Gyeonggi-Do (KR)

(72) Inventors: Byeong-Wook Yoo, Yongin (KR); Sang-Woo Pyo, Yongin (KR); Ha-Jin Song, Yongin (KR); Hyo-Yeon Kim, Yongin (KR); Hye-Yeon Shim, Yongin (KR); Ji-Young Kwon, Yongin (KR); Heun-Seung Lee, Yongin (KR); Ji-Hwan Yoon, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 40 days.

(21) Appl. No.: 14/027,170

(22) Filed: Sep. 14, 2013

(65) Prior Publication Data
US 2014/0284566 A1 Sep. 25, 2014

(30) Foreign Application Priority Data
Mar. 21, 2013 (KR) .................. 10-2013-0030575

(51) Int. Cl.
*H01L 51/50* (2006.01)
*H01L 51/52* (2006.01)
*H01L 27/32* (2006.01)

(52) U.S. Cl.
CPC ....... *H01L 51/5012* (2013.01); *H01L 27/3211* (2013.01); *H01L 51/5265* (2013.01)

(58) Field of Classification Search
CPC ............ H01L 51/5265; H01L 51/5072; H01L 51/5271; H01L 51/5278

USPC .............................................. 257/40, 88, 89
See application file for complete search history.

(56) References Cited

U.S. PATENT DOCUMENTS

| | | | |
|---|---|---|---|
| 8,053,975 B2 | 11/2011 | Chun et al. | |
| 2008/0284324 A1* | 11/2008 | Chun et al. | 313/504 |
| 2010/0176389 A1* | 7/2010 | Chun et al. | 257/40 |
| 2010/0237335 A1* | 9/2010 | Takaya | H01L 27/3211 257/40 |
| 2011/0260146 A1 | 10/2011 | Hamada et al. | |
| 2013/0105776 A1* | 5/2013 | Ishizuya | H01L 51/5064 257/40 |
| 2013/0175508 A1* | 7/2013 | Kwon | H01L 27/3211 257/40 |

(Continued)

FOREIGN PATENT DOCUMENTS

| KR | 10-2004-0104225 A | 12/2004 |
|---|---|---|
| KR | 10-0829761 B1 | 5/2008 |

(Continued)

*Primary Examiner* — Jerome Jackson, Jr.
*Assistant Examiner* — David Spalla
(74) *Attorney, Agent, or Firm* — Robert E. Bushnell, Esq.

(57) ABSTRACT

An organic light-emitting device including a first light-emitting region, a second light-emitting region, and a third light-emitting region. The organic light-emitting device includes a substrate; a first electrode layer on the substrate; a hole injection layer on the first electrode layer; a common emission layer on the hole injection layer; a first resonance assistance layer on the common emission layer in the first light-emitting region and a second resonance assistance layer on the common emission layer in the second light-emitting region.

4 Claims, 4 Drawing Sheets

(56) References Cited

U.S. PATENT DOCUMENTS

2014/0027732 A1\* 1/2014 Pyo ...................... H01L 51/506
257/40

FOREIGN PATENT DOCUMENTS

| KR | 10-2010-0083362 A | 7/2010 |
| KR | 10-2011-0117991 A | 10/2011 |

\* cited by examiner

ORGANIC LIGHT-EMITTING DEVICE

CLAIM PRIORITY

This application makes reference to, incorporates the same herein, and claims all benefits accruing under 35 U.S.C. §119 from an application earlier filed in the Korean Intellectual Property Office on 21 Mar. 2013 and there duly assigned Serial No. 10-2013-0030575.

BACKGROUND OF THE INVENTION

1. Field of the Invention

One or more embodiments of the present invention relates to an organic light-emitting device and a method of preparing the same.

2. Description of the Related Art

Organic light-emitting devices are self-light emitting devices that emit light when a voltage is applied thereto, and advantageously have high luminance, excellent contrast, multicolor capability, a wide viewing angle, a high response speed, and a low driving voltage.

The above information disclosed in this Related Art section is only for enhancement of understanding of the background of the invention and therefore it may contain information that does not form the prior art that is already known to a person of ordinary skill in the art.

SUMMARY OF THE INVENTION

The present invention provides an organic light-emitting device with improved efficiency without a roll-off phenomenon when a common emission layer is used.

According to an aspect of the present invention, there may be provided an organic light-emitting device including a first light-emitting region, a second light-emitting region, and a third light-emitting region, wherein the organic light-emitting device includes a substrate; a first electrode layer on the substrate; a hole injection layer on the first electrode layer; a common emission layer on the hole injection layer; a first resonance assistance layer on the common emission layer in the first light-emitting region and a second resonance assistance layer on the common emission layer in the second light-emitting region; a first buffer layer formed of a first host on the first resonance assistance layer and a second buffer layer formed of a second host on the second resonance assistance layer; a first emission layer including a third host and a first dopant on the first buffer layer and a second emission layer including a fourth host and a second dopant on the second buffer layer; an electron transport layer on the first emission layer, the second emission layer, and the common emission layer; and a second electrode layer on the electron transport layer.

The first resonance assistance layer and the second resonance assistance layer may be formed of a hole-transporting material.

A thickness of the first resonance assistance layer may be determined according to a resonance distance of the first light-emitting region, and a thickness of the second resonance assistance layer may be determined according to a resonance distance of the second light-emitting region.

The first host of the first buffer layer may be the same as the third host of the first emission layer, and the second host of the second buffer layer may be the same as the fourth host of the second emission layer.

The organic light-emitting device may further include a third buffer layer formed of a fifth host of an electron-transporting material on the first emission layer and a fourth buffer layer formed of a sixth host of an electron-transporting material on the second emission layer.

The first host to the fourth host, or the first host to the sixth host, may be formed of $ALq_3$, CBP, PVK, ADN, TCTA, TPBI, TBADN, E3, DSA, or a mixture thereof.

The first host of the first buffer layer and the second host of the second buffer may be hole transportive. The fifth host of the third buffer layer and the sixth host of the fourth buffer layer may be electron transportive.

The common emission layer may be a blue emission layer, the first emission layer may be a red emission layer, and the second emission layer may be a green emission layer.

The organic light-emitting device may further include an electron injection layer between the electron transport layer and the second electrode layer.

According to another aspect of the present invention, there may be provided an organic light-emitting device including a first light-emitting region, a second light-emitting region, and a third light-emitting region, wherein the organic light-emitting device includes: a substrate; a first electrode layer on the substrate; a hole injection layer on the first electrode layer; a first resonance assistance layer on the common emission layer in the first light-emitting region and a second resonance assistance layer on the common emission layer in the second light-emitting region; a first buffer layer formed of a first host having a hole transporting ability on the first resonance assistance layer and a second buffer layer formed of a second host having a hole transporting ability on the second resonance assistance layer; a first emission layer including a third host and a first dopant on the first buffer layer, a second emission layer including a fourth host and a second dopant on the second buffer layer, and a third emission layer including a fifth host and a third dopant on the hole injection layer; an electron transport layer on the first emission layer, the second emission layer, and the common emission layer; and a second electrode layer on the electron transport layer.

The organic light-emitting device may further include a third buffer layer formed of a sixth host having an electron transporting ability on the first emission layer and a fourth buffer layer formed of a seventh host having an electron transporting ability on the second emission layer.

The first host of the first buffer layer and the second host of the second buffer may be hole transportive. The sixth host of the third buffer layer and the seventh host of the fourth buffer layer may be electron transportive.

The first host to the seventh host may be formed of $Alq_3$, CBP, PVK, ADN, TCTA, TPBI, TBADN, E3, DSA, or a mixture thereof.

According to another aspect of the present invention, there may be provided an organic light-emitting device including a first light-emitting region, a second light-emitting region, and a third light-emitting region, wherein the organic light-emitting device includes: a substrate; a first electrode layer on the substrate; a hole injection layer on the first electrode layer; a first resonance assistance layer on the hole injection layer in the first light-emitting region and a second resonance assistance layer on the hole injection layer in the second light-emitting region; a first buffer layer formed of a first host on the first resonance assistance layer and a second buffer layer formed of a second host on the second resonance assistance layer; a first emission layer including a third host and a first dopant on the first buffer layer and a second emission layer including a fourth host and a second dopant on the second buffer layer; a common emission layer on the first emission layer, the second emission layer, and the hole injection layer; an electron transport layer on the common emission layer; and a second electrode layer on the electron transport layer.

The first host of the first buffer layer may be the same as the third host of the first emission layer.

The second host of the second buffer layer may be the same as the fourth host of the second emission layer.

The first host to the fourth host may be formed of $Alq_3$, CBP, PVK, ADN, TCTA, TPBI, TBADN, E3, DSA, or a mixture thereof.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
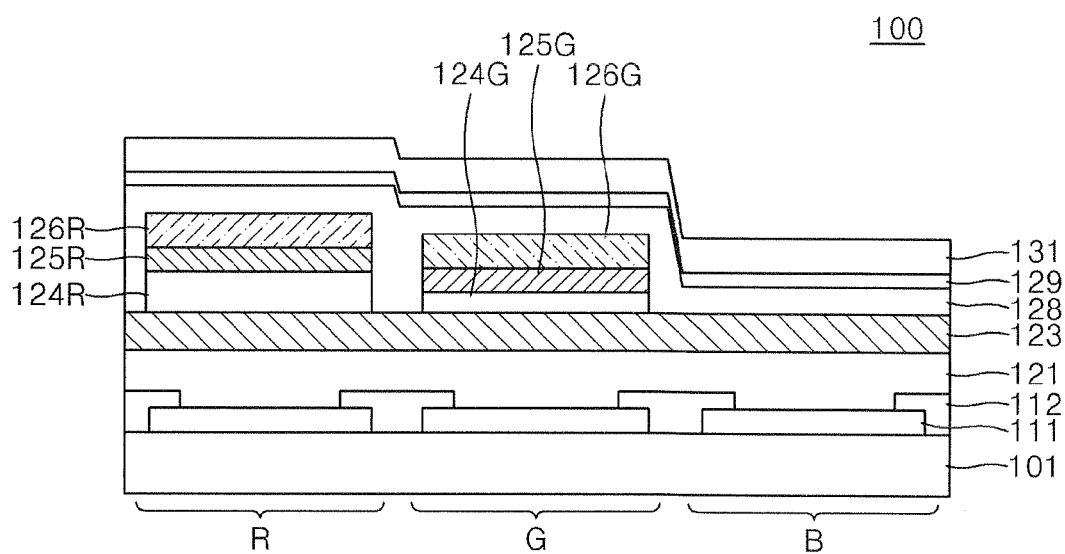
FIG. 1 is a schematic cross-sectional view of an organic light-emitting device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions are exaggerated for clarity. Like reference numerals in the drawings denote like elements, and thus their description will not be repeated herein.

As used herein, a hole-transporting host denotes a host having a hole transporting ability that is higher than an electron transporting ability.

As used herein, an electron-transporting host denotes a host having an electron transporting ability that is higher than a hole transporting ability.

As used herein, a roll off phenomenon denotes a phenomenon of efficiency rapidly dropping as luminance increases.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An organic light-emitting device may have a structure including an organic emission layer disposed between an anode and a cathode. When a voltage is applied across the electrodes, holes are injected from the anode and electrons are injected from the cathode into the organic emission layer. The injected holes and electrons undergo electron exchanges in adjacent molecules in the organic emission layer, thereby migrating to opposite electrodes. An electron-hole pair recombined in a certain molecule forms a molecular exiton in a high-energy excited state. Molecular exitons emit unique light of a material itself while returning a low-energy ground state.

An organic light-emitting device includes a plurality of pixels and each pixel includes a red light-emitting region, a green light-emitting region, and a blue light-emitting region. In this case, a patterning process may be simplified by forming the blue emission layer as a common layer. When a common layer is formed, efficiency tends to rapidly drop (hereinafter referred to as "roll off") at a high luminance compared to when a common layer is not formed.

FIG. 1 is a schematic cross-sectional view of an organic light-emitting device 100 according to an embodiment of the present invention. The organic light-emitting device 100 includes sub-pixel regions of a red light-emitting region R, a green light-emitting region G, and a blue light-emitting region B.

The organic light-emitting device 100 includes a substrate 101, an anode 111, a hole injection layer 121, a common emission layer 123, a first resonance assistance layer 124R and a second resonance assistance layer 124G, a first buffer layer 125R and a second buffer layer 125G, a red emission layer 126R and a green emission layer 126G, an electron transport layer 128, an electron injection layer 129, and a cathode 131.

The substrate 101 may be any substrate that may be used in existing organic light-emitting devices. In some embodiments, the substrate 101 may be a glass substrate or a transparent plastic substrate with high mechanical strength, thermal stability, transparency, surface smoothness, ease of handling, and water resistance. The substrate 101 may be formed of an opaque material such as silicon, stainless steel, or the like.

The anode 111 may be divided into each sub-pixel region by an insulating layer 112 on the substrate 101. The anode 111 may be formed of a material with a relatively high work function. The anode 111 may be formed of, but is not limited to, a transparent conductive oxide, for example, indium tin oxide (ITO), indium zinc oxide (IZO), zinc oxide (ZnO), Al-doped zinc oxide (AZO), indium oxide ($In_2O_3$) or tin oxide ($SnO_2$). The anode 111 may be formed by a vapor deposition method or a sputtering method.

The hole injection layer 121 may be formed on the anode 111 and the insulating layer 112. The hole injection layer 121 may be formed of, for example, a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4'4''-tris(N,N-diphenylamino)triphenylamine (TDATA), 4,4',4''-tris{N,-(2-naphthyl)-N-phenylamino}-triphenylamine (2T-NATA), poly(3,4-ethylenedioxythiophene)/poly(4-styrenesulfonate) (PEDOT/PSS), polyaniline/dodecylbenzenesulfonic acid (Pani/DBSA), polyaniline/Camphor sulfonicacid (Pani/CSA), polyaniline/poly(4-styrenesulfonate) (PANI/PSS), or the like, but is not limited thereto.

The hole injection layer 121 may be formed by using any of a variety of methods, for example, by vacuum deposition, spin coating, casting, Langmuir-Blodgett (LB) deposition, or the like.

When the hole injection layer 121 may be formed by vacuum deposition, the deposition conditions may vary according to a compound used to form the hole injection layer 121 or the desired characteristics of the hole injection layer 121. For example, the deposition conditions may include a deposition temperature of about 100° C. to about 500° C., a vacuum pressure of about $10^{-8}$ Torr to about $10^{-3}$ Torr, and a deposition rate of about 0.01 Å/sec to about 100 Å/sec.

When the hole injection layer 121 may be formed using spin coating, coating conditions may vary according to a compound used to form the hole injection layer 121 or the desired characteristics of the hole injection layer 121. For example, the deposition conditions may include a coating speed of about 2,000 rpm to about 5,000 rpm, and a thermal treatment temperature of about 80° C. to about 200° C. at which the solvent remaining after coating may be removed.

The hole injection layer 121 may have a thickness of about 100 Å to about 10,000 Å, and in some embodiments, may have a thickness of about 100 Å to about 1,000 Å. When the thickness of the hole injection layer 121 is within these ranges, a satisfactory hole injecting ability of the hole injection layer 121 may be obtained without a substantial decrease in a driving voltage.

The hole injection layer 121 may further include a charge-generating material to improve conductivity of the layer or the like. The charge-generating material may be, for example, a p-dopant. Examples of the p-dopant may include quinone derivatives such as tetra-cyanoquinodimethane (TCNQ) and 2,3,5,6-tetrafluoro-tetracyano-1,4-benzoquinodimethane (F4TCNQ); perylene-3,4,9,10-tetracarboxylic dianhydride (PTCDA); metal oxides such as a tungsten oxide and a molybdenum oxide; and cyano-containing compounds, but are not limited thereto.

A blue common emission layer 123 may be formed as a common layer on the red light-emitting region R, the green light-emitting region G, and the blue light-emitting region B on the hole injection layer 121. The blue common emission layer 123 may include a blue host and a blue dopant.

Examples of the blue host include $Alq_3$, 4,4'-N,N'-dicabazole-biphenyl (CBP), poly(n-vinylcabazole) (PVK), 9,10-di(naphthalene-2-yl)anthracene (ADN), TCTA, 1,3,5-tris(N-phenylbenzimidazole-2-yl)benzene (TPBI), 3-tert-butyl-9, 10-di(naphth-2-yl) anthracene (TBADN), E3, distyrylarylene (DSA), or a mixture thereof, but are not limited thereto.

Examples of the blue dopant include $F_2$Irpic, $(F_2$ ppy$)_2$Ir (tmd), Ir(dfppz)$_3$, ter-fluorene, 4,4'-bis(4-diphenylaminostyryl)biphenyl (DPAVBi), or 2,5,8,11-tetra-t-butylperylene (TBPe), but are not limited thereto.

The blue common emission layer 123 may be formed by vacuum deposition, spin coating, casting, Langmuir-Blodgett (LB) deposition, or the like. When the blue common emission layer 123 may be formed by vacuum deposition and spin coating, the deposition conditions may vary according to a compound used to form the blue common emission layer 123, but may be substantially the same as those applied to form a hole injection layer in general. In order to form a layer including a host and a dopant, a co-deposition method may be used.

A thickness of the blue common emission layer 123 may be about 100 Å to about 1,000 Å. An amount of the blue dopant in the blue common emission layer 123 may be generally about 0.01 wt % to about 15 wt % based on a total weight of the blue common emission layer 123, but is not limited thereto.

The first resonance assistance layer 124R is formed on the blue common emission layer 123 of the red light-emitting region R, and the second resonance assistance layer 124G may be formed on the blue common emission layer 123 of the green light-emitting region G.

The first resonance assistance layer 124R and the second resonance assistance layer 124G serve as a hole transport layer and may be formed of a hole transporting material. The first resonance assistance layer 124R and the second resonance assistance layer 124G may be formed of the same material. Examples of the hole transporting material include carbazole derivatives such as N-phenylcarbazole and polyvinylcarbazole, and triphenylamine-based materials such as N,N-bis(3-methylphenyl)-N,N-diphenyl-[1,1-biphenyl]-4, 4'-diamine (TPD), N,N'-di(1-naphthyl)-N,N'-diphenylbenzidine (NPB), and 4,4',4"-tris(N-carbazolyl)triphenylamine (TCTA), but are not limited thereto.

The first resonance assistance layer 124R and the second resonance assistance layer 124G may be formed by vacuum deposition, spin coating, casting, Langmuir-Blodgett (LB) deposition, or the like.

A thickness of the first resonance assistance layer 124R may be about 30 Å to about 700 Å, for example, about 50 Å to about 200 Å. A thickness of the second resonance assistance layer 124G may be about 30 Å to about 300 Å, for example, about 50 Å to about 100 Å.

The first resonance assistance layer 124R and the second resonance assistance layer 124G may each be formed to have an appropriate thickness in order to control a resonance distance of red light emission and green light emission and a region where electrons and holes recombine. Here, a thickness of the first resonance assistance layer 124R may be thicker than a thickness of the second resonance assistance layer 124G.

The first buffer layer 125R may be formed on the first resonance assistance layer 124R, and the second buffer layer 125G may be formed on the second resonance assistance layer 124G.

The first buffer layer 125R may be formed of a host material that may be included in the red emission layer. Likewise, the second buffer layer 125G may be formed of a host material that may be included in the green emission layer. The host materials may be a hole-transporting host, an electron-transporting host, or a mixture thereof. The host material which may be included in the first buffer layer 125R and the second buffer layer 125G may be $Alq_3$, CBP, PVK, ADN, TCTA, TPBI, TBADN, E3, DSA, or a mixture thereof, as in the case of the blue host, but is not limited thereto.

The first buffer layer 125R and the second buffer layer 125G may be formed by using any of a variety of methods, for example, by vacuum deposition, spin coating, casting, Langmuir-Blodgett (LB) deposition, or the like. A thickness of each of the first buffer layer 125R and the second buffer layer 125G may be about 30 Å to about 600 Å.

The first buffer layer 125R and the second buffer layer 125G may lower a hole-transporting energy barrier. Also, the first buffer layer 125R and the second buffer layer 125G may each form a lowest unoccupied molecular level (LUMO) that may be lower than that of the first resonance assistance layer 124R and the second resonance assistance layer 124G so that electrons are not streamed out but blocked by the first resonance assistance layer 124R and the second resonance assistance layer 124G and contribute to light emission. In this regard, a driving voltage may be lowered, and a phenomenon whereby efficiency may be reduced at high luminance may be prevented.

The red emission layer 126R may be formed on the first buffer layer 125R. The red emission layer 126R may include a red host and a red dopant. The red host, like the first buffer layer 125R, may include $Alq_3$, CBP, PVK, ADN, TCTA, TPBI, TBADN, E3, DSA, or a mixture thereof, but is not limited thereto. The red host may include the same material as that of the first buffer layer 125R or may include a different material.

Examples of the red dopant include PtOEP, $Ir(piq)_3$, $Btp_2Ir(acac)$, $Ir(piq)_2(acac)$, $Ir(2-phq)_2(acac)$, $Ir(2-phq)_3$, $Ir(flq)_2(acac)$, $Ir(fliq)_2(acac)$, DCM, or DCJTB, but are not limited thereto.

The green emission layer 126G may be formed on the second buffer layer 125G. The green emission layer 126G may include a green host and a green dopant. The green host, like the second buffer layer 125G, may include $Alq_3$, CBP, PVK, ADN, TCTA, TPBI, TBADN, E3, DSA, or a mixture thereof, but is not limited thereto. The green host may include the same material as that of the second buffer layer 125G or may include a different material.

Examples of the green dopant include tris(2-phenylpyridine) iridium ($Ir(ppy)_3$), bis(2-phenylpyridine)(acetylacetonato)iridium(III) ($ir(ppy)_2(acac)$), tris(2-(4-tolyl)phenylpyridine)iridium ($ir(mppy)_3$), 10-(2-benzothiazolyl)-1,1,7,7-tetramethyl-2,3,6,7-tetrahydro-1H,5H,11H-[1]benzopyrano[6,7,8-ij]-quinolizin-11-one (C545T), or the like, but are not limited thereto.

The red emission layer 126R and the green emission layer 126G may be formed by using any of a variety of methods, for example, by vacuum deposition, spin coating, casting, Langmuir-Blodgett (LB) deposition, or the like. In order to form the red emission layer 126R and the green emission layer 126G including a host and a dopant, a co-deposition method may be used. When the first buffer layer 125R and the red emission layer 126R include the same host, they may be formed in a same chamber. Also, when the second buffer layer 125G and the green emission layer 126G include the same host, they may be formed in a same chamber. A thickness of each of the red emission layer 126R and the green emission layer 126G may be about 100 Å to about 1,000 Å.

The amount of a dopant in the red emission layer 126R and the green emission layer 126G and the amount of a blue dopant of the blue common emission layer 126B may range from about 0.01 wt % to about 15 wt % based on a total weight of each emission layer, but are not limited thereto.

The electron transport layer 128 may be formed on the blue common emission layer 123, the red emission layer 126R, and the green emission layer 126G. The electron transport layer 128 may be a layer that transports holes injected from the cathode 131 to each emission layer and may include a well-known material, for example, $Alq_3$, 2,9-dimethyl-4,7-diphenyl-1,10-phenanthroline (BCP), 4,7-diphenyl-1,10-phenanthroline (Bphen), 3-(biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), bis(2-methyl-8-quinolinolato-N1,O8)-(1,1tylphenyl)-1,3,4-oxadiazorganic light-emitting device (BAlq), beryllium bis(benzoquinolin-10-olate) (Bebq$_2$), 9,10-di(naphthalene-2-yl)anthrascene (ADN), or the like, but is not limited thereto.

The electron transport layer 128 may be formed by using any of a variety of methods, for example, by vacuum deposition, spin coating, casting, or the like. When the electron transport layer 128 is formed by vacuum deposition and spin coating, the conditions may vary according to a compound used to form the electron transport layer 127 but may be substantially the same as those applied to form the hole injection layer 121.

The electron transport layer 128 may have a thickness of about 100 Å to about 1,000 Å, for example, about 150 Å to about 500 Å. When the thickness of the electron transport layer 127 is within these ranges, the electron transport layer 128 may have a satisfactory hole transporting ability without a substantial increase in a driving voltage.

The electron transport layer 128 may include an electron transporting organic compound and a metal-containing material. The metal-containing material may include lithium (Li) complex. Examples of the Li complex include lithium quinolate (LiQ), Formula 103 below, or the like.

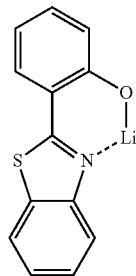

Formula 103

The electron injection layer 129 for facilitating injection of electrons from the cathode 131 may be stacked on the electron transport layer 128. The electron injection layer 129 may be formed of a well-known material for forming an electron injection layer, such as LiF, NaCl, CsF, Li$_2$O, BaO, or the like, but is not limited thereto. The deposition conditions of the electron injection layer 129 may vary according to a compound used to form the electron injection layer 129 but may be substantially the same as those applied to the hole injection layer 121.

The electron injection layer 129 may have a thickness ranging from about 1 Å to about 100 Å, for example, about 3 Å to about 90 Å. When the thickness of the electron injection layer 129 is within these ranges, the electron injection layer 129 may have satisfactory electron injection ability without a substantial increase in a driving voltage.

Optionally, the electron transport layer 128 and the electron injection layer 129 may be substituted with a functional layer having both electron transfer and electron injection abilities.

The cathode 131 on the electron injection layer 129 may be formed of metal, an alloy, an electrical conductive compound, and a mixture thereof, each of which has a low work function. The cathode 131 may be formed as a transmissive electrode by forming a thin film of, for example, lithium (Li), magnesium (Mg), aluminium (Al), aluminium-lithium (Al—Li), calcium (Ca), magnesium-indium (Mg—In), magnesium-silver (Mg—Ag), or the like. Various changes may be made; for example, in order to obtain a top emission-type organic light-emitting device, the transmissive electrode may be formed of ITO, IZO, or the like.

A capping layer (not shown) may be formed on the cathode 131 to maximize luminous intensity efficiency by improving optical characteristics. The capping layer (not shown) may be formed of, for example, a metal oxide layer, a metal nitride layer, or a metal oxynitride layer. The capping layer (not shown) may be, for example, MoOx(x=2~4), Al$_2$O$_3$, Sb$_2$O$_3$, BaO, CdO, CaO, Ce$_2$O$_3$, CoO, Cu$_2$O, DyO, GdO, HfO$_2$, La$_2$O$_3$, Li$_2$O, MgO, NbO, NiO, Nd$_2$O$_3$, PdO, Sm$_2$O$_3$, ScO, SiO$_2$, SrO, Ta$_2$O$_3$, TiO, WO$_3$, VO$_2$, YbO, Y$_2$O$_3$, ZnO, ZrO, AlN, BN, NbN, SiN, TaN, TiN, VN, YbN, ZrN, SiON, AlON, or a mixture thereof.

Figure 2:
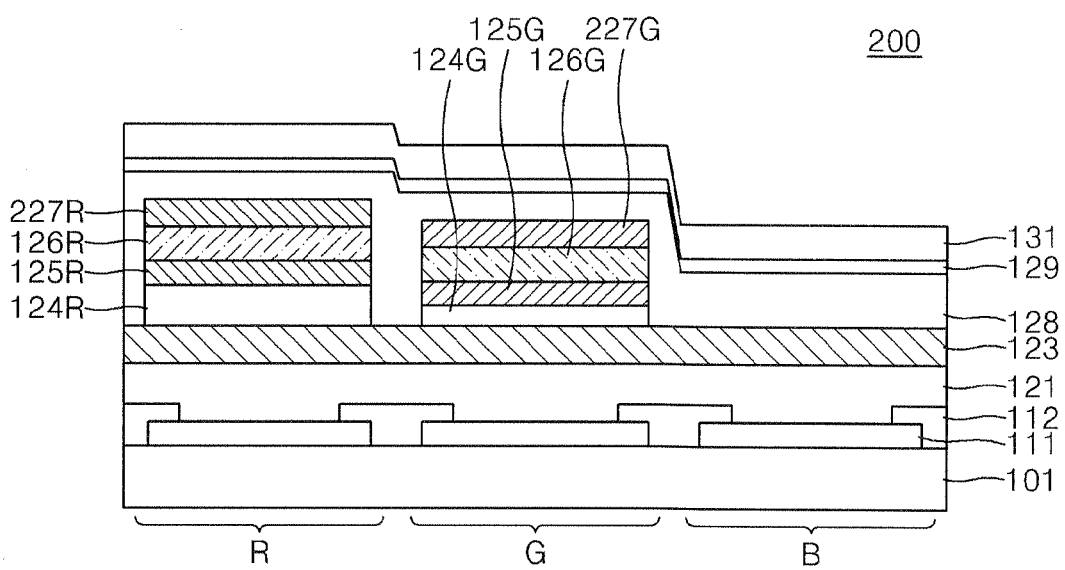
FIG. 2 is a schematic cross-sectional view of an organic light-emitting device according to another embodiment of the present invention.

FIG. 2 is a schematic cross-sectional view of an organic light-emitting device 200 according to another embodiment of the present invention. The organic light-emitting device 200 of FIG. 2 will be described by mainly focusing on differences between it and the organic light-emitting device 100 of FIG. 1. The organic light-emitting device 200 of FIG. 2 is different from the organic light-emitting device 100 of FIG. 1 in that each of a third buffer layer 227R and a fourth buffer layer 227G are formed on a red emission layer 126R and a green emission layer 126G. Also, a host of the red emission layer 126R or the green emission layer 126G may be a mixture of a hole-transporting host and an electron-transporting host.

The third buffer layer 227R and the fourth buffer layer 227G, like the first buffer layer 125R and the second buffer layer 125G, may be formed of a host material that may be included in each of the red emission layer 126R and the green emission layer 126G. In some exmples, the first and second buffer layers 125R and 125G may include a host material having a good hole transporting ability, and the third and fourth buffer layers 227R and 227G may include a host having a good electron transporting ability. The host having a good hole transporting ability denotes a host having a hole transporting ability including injection of holes, which is greater than an electron transporting ability, and the host having a good electron transporting ability denotes a host having an electron transporting ability including injection of electrons, which is greater than a hole transporting ability. For example, the first and second buffer layers 125R and 125G may include CBP, TCTA, or a mixture thereof, and the third and fourth buffer layers 227R and 227G may include BCP, BPhen, Balq, TAZ, or a mixture thereof.

An emission host material having a good electron transporting ability may be used as the third and fourth buffer layers 227R and 227G to lower an electron-transporting energy barrier and enhance a hole blocking ability, and thus an abundant amount of exitons may be formed in the emission layer, thereby maximizing a luminous intensity efficiency. In this regard, luminous intensity efficiency and roll-off characteristics may be improved. Also, the third and fourth buffer layers 227R and 227G improve interface characteristics of the emission layer and the electron transport layer, and thus lifespan of a device may be improved, and damage to the emission layer caused by heat when the emission layer may be formed by using a laser heat transfer method may be prevented.

Optionally, a buffer layer (not shown) formed of a blue host may be disposed on a blue common emission layer 123 at a blue light-emitting region B.

Figure 3:
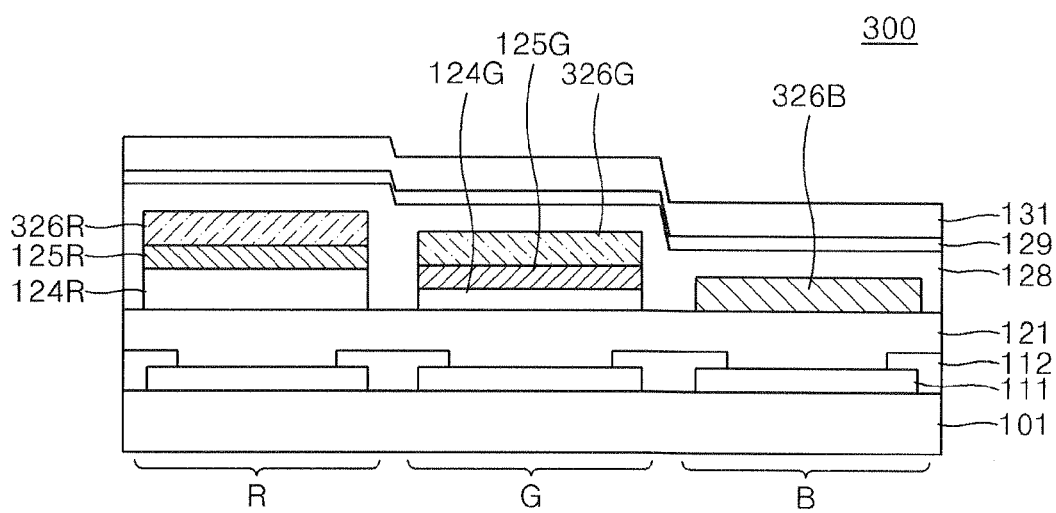
FIG. 3 is a schematic cross-sectional view of an organic light-emitting device according to another embodiment of the present invention.

FIG. 3 is a schematic cross-sectional view of an organic light-emitting device 300 according to another embodiment of the present invention. The organic light-emitting device 300 of FIG. 3 will be described by mainly focusing on differences between it and the organic light-emitting device 100 of FIG. 1. The organic light-emitting device 300 of FIG. 3 may be different from the organic light-emitting device 100 of FIG. 1 in that the blue common emission layer 123 may be not used but red, green, and blue emission layers 326R, 326G, and 326B are each formed at each light-emitting region of the organic light-emitting device 300 of FIG. 3.

When a common emission layer is not used, a first buffer layer 125R and a second buffer layer 125G may be used to lower the hole-transporting energy barrier and increase a degree of light-emitting contribution of electrons, and thus a driving voltage of the device may be lowered, and a roll-off phenomenon may be reduced.

Optionally, a fifth buffer layer (not shown) formed of a blue host having an electron transporting ability may be formed on the blue emission layer 326B. For example, the fifth buffer layer may be formed of ADN, DSA, BCP, BPhen, Balq, or TAZ, but is not limited thereto.

Figure 4:
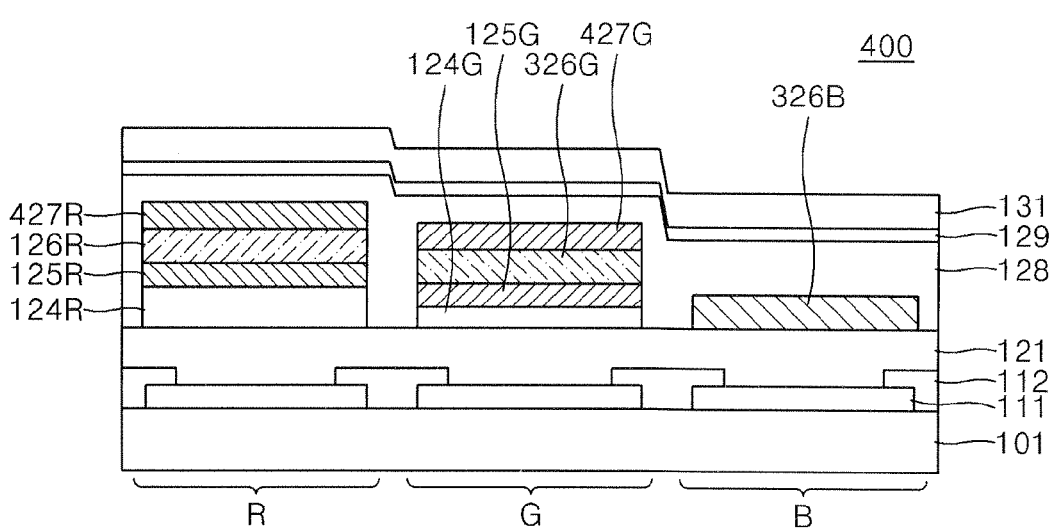
FIG. 4 is a schematic cross-sectional view of an organic light-emitting device according to another embodiment of the present invention.

FIG. 4 is a schematic cross-sectional view of an organic light-emitting device 400 according to another embodiment of the present invention. The organic light-emitting device 400 of FIG. 4 will be described by mainly focusing on differences between it and the organic light-emitting device 100 of FIG. 1. The organic light-emitting device 400 of FIG. 4 may be different from the organic light-emitting device 100 of FIG. 1 in that the blue common emission layer 123 is not used but red, green, and blue emission layers 326R, 326G, and 326B are each formed at each light-emitting region of the organic light-emitting device 400 of FIG. 4. Also, the organic light-emitting device 400 of FIG. 4 is different from the organic light-emitting device 100 of FIG. 1 in that a third buffer layer 427R and a fourth buffer layer 427G are formed on each of the red emission layer 326R and the green emission layer 326G, respectively.

When a common emission layer is not used, an emission host having a good electron transporting ability may be used as the third buffer layer 427R and the fourth buffer layer 427G to lower the electron-transporting energy barrier and enhance a hole blocking ability, and thus an abundant amount of exitons may be formed in the emission layer, thereby maximizing a luminous intensity efficiency. In this regard, luminous intensity efficiency and roll-off characteristics may be improved.

Figure 5:
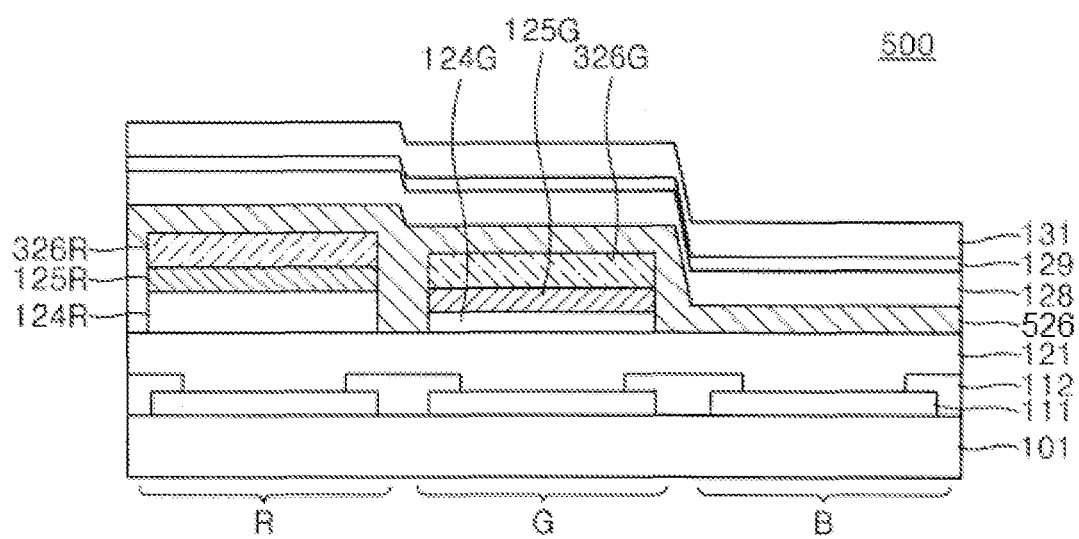
FIG. 5 is a schematic cross-sectional view of an organic light-emitting device according to another embodiment of the present invention.

FIG. 5 is a schematic cross-sectional view of an organic light-emitting device 500 according to another embodiment of the present invention. The organic light-emitting device 500 of FIG. 5 will be described by mainly focusing on differences between it and the organic light-emitting device 100 of FIG. 1. The organic light-emitting device 500 of FIG. 5 is different from the organic light-emitting device 100 of FIG. 1 in that a blue common emission layer 526 may be formed between the red emission layer 126R and the green emission layer 126G; and the electron transport layer 128 instead of the hole injection layer 121; and the red emission layer 126R and the green emission layer 126G. Since blue emission host material generally has an excellent electron transporting ability, when the blue common emission layer 526 may be formed on the red emission layer 126R and the green emission layer 126G, an electron transporting ability may be improved, and thus a driving voltage may decrease, and a second buffer layer may not be needed.

Thus far, the case where a blue emission layer may be used as a common emission layer has been described. Alternatively, a red emission layer or a green emission layer may be used as a common emission layer. For example, the red emission layer may be formed as a common emission layer, and a green emission layer and a blue emission layer may be patterned. Alternatively, the green emission layer may be formed as a common emission layer and the red emission layer and the blue emission layer may be patterned.

In addition to the organic layers described above, a hole blocking layer (not shown) or an electron blocking layer (not shown) may be further disposed or stacking layers on a substrate may start from a cathode.

Example 1

As an anode, a 15 $\Omega/cm^2$ (500 Å) Corning ITO glass substrate was cut into a size of 50 mm×50 mm×0.7 mm, washed with ultrasonic waves in isopropyl alcohol and pure water for 5 minutes each, and then cleaned with UV and ozone for 30 minutes. MTDATA was vacuum-deposited on the ITO glass substrate to form a hole injection layer with a thickness of 1,200 Å. Then, a blue common emission layer with a thickness of 200 Å was formed on the hole injection layer by using 94 wt % of TBADN as a blue host and 5 wt % of DPAVBI as a blue dopant. NPB was vacuum-deposited on the blue emission layer to form a resonance assistance layer with a thickness of 100 Å, and then a host material CBP may be formed at a thickness of 100 Å as a first buffer layer on the resonance assistance layer. A green emission layer with a thickness of 400 Å was formed on the first buffer layer by using 95 wt % of CBP as a green host and 5 wt % of Ir(ppy)$_3$ 5 as a green dopant. CBP was vacuum-deposited on the green emission layer to form a second buffer layer with a thickness of 100 Å. An electron transport layer with a thickness of 300 Å was formed by vacuum-depositing Alq$_3$ on the second buffer layer, and then LiQ was vacuum-deposited thereon to form an electron injection layer with a thickness of 10 Å. Then, Al was vacuum-deposited on the electron injection layer to form a cathode with a thickness of 1,200 Å, thereby completely manufacturing an organic light-emitting device.

Example 2

An organic light-emitting device was manufactured in the same manner as in Example 1, except that the resonance assistance layer was formed of p-doped NPB instead of the NPB of Example 1.

Comparative Example 1

An organic light-emitting device was manufactured in the same manner as in Example 1, except that the first and second buffer layers were not formed.

Table 1 shows driving voltages and light-emission efficiencies of the organic light-emitting devices manufactured according to Examples 1 and 2, and Comparative Example 1. Referring to Table 1, the driving voltages of the organic light-emitting devices manufactured according to Examples 1 and 2 are lower than that the driving voltage of the organic light-emitting device manufactured according to Comparative Example 1, and the luminous intensity efficiencies of the organic light-emitting devices manufactured according to Examples 1 and 2 are twice as high as the light emitting efficiency of the organic light-emitting device manufactured according to Comparative Example 1.

TABLE 1

|  | Driving voltage (V) | Luminous intensity efficiency (Cd/A) |
|---|---|---|
| Example 1 | 3.9 | 100.0 |
| Example 2 | 3.5 | 102.0 |
| Comparative Example 1 | 4.2 | 54.5 |

Figure 6:
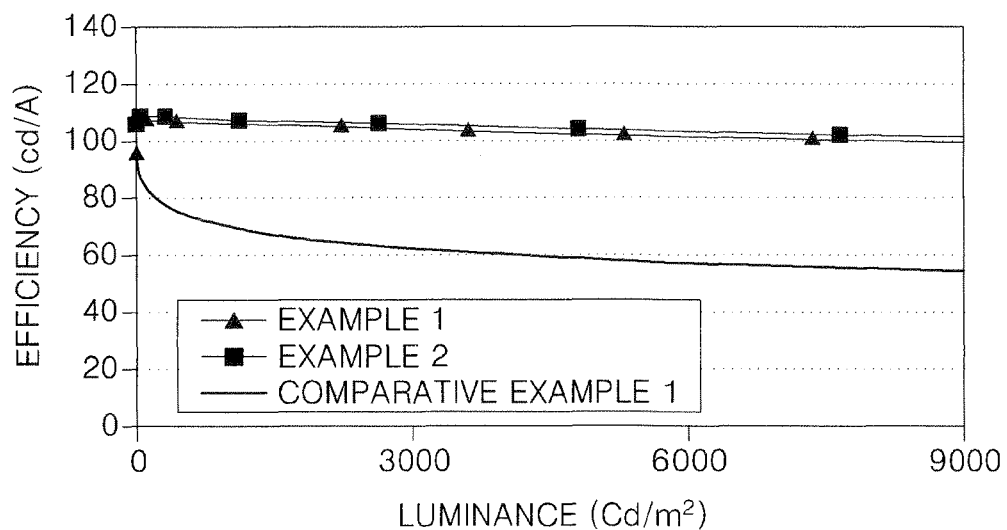
FIG. 6 is a graph showing a relationship between a luminous intensity efficiency and a luminance of organic light-emitting devices prepared in Examples 1 and 2 and Comparative Example 1.

FIG. 6 is a graph showing a relationship between a luminous intensity efficiency and a luminance of organic light-emitting devices prepared in Examples 1 and 2 and Comparative Example 1. A luminous intensity efficiency (Cd/A) may be a measure of an intensity of light emitted per unit current. Referring to FIG. 6, luminous intensity efficiency values of the organic light-emitting devices prepared in Examples 1 and 2 were about twice as large as a luminous intensity efficiency value of the organic light-emitting device prepared in Comparative Examples 1. Also, a roll-off phenomenon, which is a phenomenon whereby a luminous intensity efficiency decreases according to an increase in luminance, of the organic light-emitting devices prepared in Examples 1 and 2, occurred significantly less than in the organic light-emitting device prepared in Comparative Examples 1.

Example 3

An organic light-emitting device was manufactured in the same manner as in Example 1, except that a mixture of CBP and BAlq was used as a host material of the green emission layer.

Example 4

An organic light-emitting device was manufactured in the same manner as in Example 3, except that the mixture used in Example 3 as the host material in green light-emitting region was used as a material of the first buffer layer.

Example 5

An organic light-emitting device was manufactured in the same manner as in Example 3, except that a material used for the resonance assistance layer in Example 2 was used as a resonance assistance layer material.

Comparative Example 2

An organic light-emitting device was manufactured in the same manner as in Comparative Example 1, except that a mixture of CBP and Balq was used as the green emission layer material instead of CBP.

Table 2 shows driving voltages and light-emission efficiencies of the organic light-emitting devices manufactured according to Examples 3 to 5, and Comparative Example 2. Referring to Table 2, the driving voltages of the organic light-emitting devices manufactured according to Examples 3 to 5 are lower than the driving voltage of the organic light-emitting device manufactured according to Comparative Example 2, and the luminous intensity efficiency values of the organic light-emitting devices manufactured according to Examples 3 to 5 are twice as large as a light emitting efficiency value of the organic light-emitting device manufactured according to Comparative Example 2.

TABLE 2

|  | Driving voltage (V) | Luminous intensity efficiency (Cd/A) |
|---|---|---|
| Example 3 | 4.5 | 98.3 |
| Example 4 | 4.6 | 94.2 |
| Example 5 | 4.0 | 105.9 |
| Comparative Example 2 | 4.8 | 74.8 |

Figure 7:
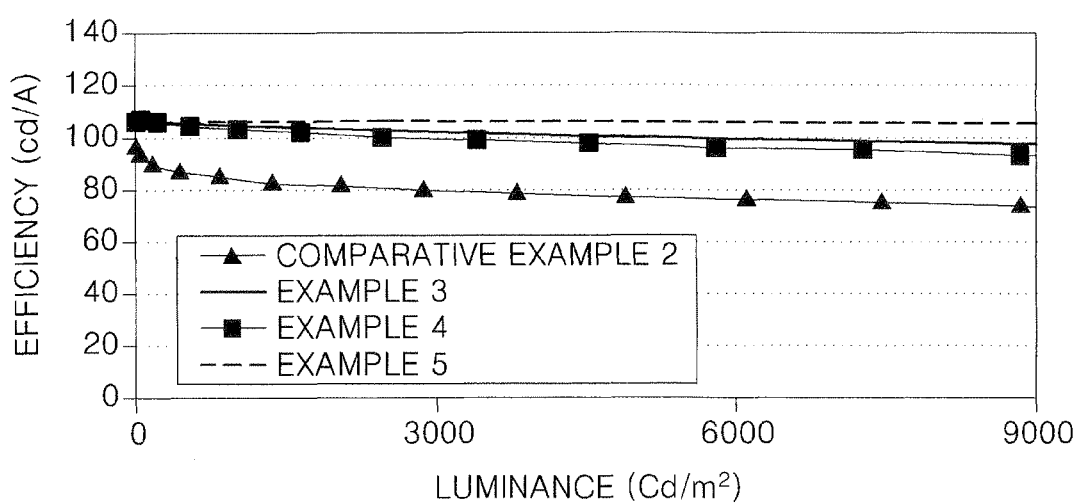
FIG. 7 is a graph showing a relationship between a luminous intensity efficiency and a luminance of organic light-emitting devices prepared in Examples 3 to 5 and Comparative Example 2.

FIG. 7 is a graph showing a relationship between a luminous intensity efficiency and a luminance of organic light-emitting devices prepared in Examples 3 to 5 and Comparative Example 2. Referring to FIG. 7, the luminous intensity efficiencies of the organic light-emitting devices prepared in Examples 3 to 5 are higher than the luminous intensity efficiency of the organic light-emitting device prepared in Comparative Example 2. The organic light-emitting device prepared in Example 5 has the lowest driving voltage and the highest luminous intensity efficiency.

Efficiency of an organic light-emitting device may be increased by improving a roll-off phenomenon by using a buffer layer formed of a host between a hole transport layer and an emission layer or between an emission layer and an electron transport layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting device comprising a first light-emitting region, a second light-emitting region, and a third light-emitting region, the organic light-emitting device comprising:
    a substrate;
    a first electrode layer on the substrate;
    a hole injection layer on the first electrode layer;
    a first resonance assistance layer on the hole injection layer in the first light-emitting region and a second resonance assistance layer on the hole injection layer in the second light-emitting region;
    a first buffer layer formed of a first host on the first resonance assistance layer and a second buffer layer formed of a second host on the second resonance assistance layer;
    a first emission layer comprising a third host and a first dopant on the first buffer layer and a second emission layer comprising a fourth host and a second dopant on the second buffer layer;
    a common emission layer on the first emission layer, the second emission layer, and the hole injection layer;
    an electron transport layer on the common emission layer; and
    a second electrode layer on the electron transport layer.

2. The organic light-emitting device of claim 1,
    the first host of the first buffer layer being same as the third host of the first emission layer, and
    the second host of the second buffer layer being same as the fourth host of the second emission layer.

3. The organic light-emitting device of claim 1, the first host and the second host being each independently formed of CBP, TCTA, or a mixture thereof.

4. The organic light-emitting device of claim 1, the third host and the fourth host being each independently formed of CBP, TCTA, BCP, BPhen, Balq, TAZ, or a mixture thereof.

* * * * *